US010715090B2

(12) United States Patent
Sakai et al.

(10) Patent No.: US 10,715,090 B2
(45) Date of Patent: Jul. 14, 2020

(54) BIAS CIRCUIT WITH A REPLICA CIRCUIT FOR AN AMPLIFIER CIRCUIT AND A GENERATION CIRCUIT SUPPLYING BIAS VOLTAGE TO THE REPLICA AND AMPLIFIER CIRCUITS AND OPTICAL RECEIVER

(71) Applicant: FUJITSU LIMITED, Kawasaki-shi, Kanagawa (JP)

(72) Inventors: Yasufumi Sakai, Fuchu (JP); Yoshiyasu Doi, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 211 days.

(21) Appl. No.: 16/037,222

(22) Filed: Jul. 17, 2018

(65) Prior Publication Data
US 2019/0028071 A1 Jan. 24, 2019

(30) Foreign Application Priority Data

Jul. 21, 2017 (JP) ................................ 2017-142067

(51) Int. Cl.
*H03F 3/08* (2006.01)
*H04B 10/69* (2013.01)
(Continued)

(52) U.S. Cl.
CPC ............... *H03F 3/082* (2013.01); *G01J 1/44* (2013.01); *H03F 1/308* (2013.01); *H03F 3/3022* (2013.01);
(Continued)

(58) Field of Classification Search
CPC ........ H03F 3/082; H03F 3/345; H03F 3/3022; H03F 1/308; H03F 2200/453; G01J 1/44; H03K 3/356017; H04B 10/693
See application file for complete search history.

(56) References Cited

U.S. PATENT DOCUMENTS 5,216,383 A * 6/1993 Uittenbogaard ....... H03G 1/007
330/277
5,381,114 A * 1/1995 Pena-Finol ......... H03F 3/45192
330/253
(Continued)

FOREIGN PATENT DOCUMENTS

JP 63-36612 2/1988
JP 2001-326377 11/2001
(Continued)

OTHER PUBLICATIONS

Mohamed Atef et al., "10Gb/s Inverter Based Cascode Transimpedance Amplifier in 40nm CMOS Technology", Vienna University of Technology, Institute of Electrodynamics Microwave and Circuit Engineering, Gusshausstrasse 25/354,1040 Vienna, Austria, pp. 1-4, Apr. 8, 2013 (4 pages).

*Primary Examiner* — Que Tan Le
*Assistant Examiner* — Jennifer D Bennett
(74) *Attorney, Agent, or Firm* — Fujitsu Patent Center

(57) ABSTRACT

A bias circuit includes a replica circuit for an amplifier circuit using a cascode type inverter, and a generation circuit that generates a bias voltage that causes a drain voltage of an input stage transistor of the amplifier circuit to be a saturation drain voltage, based on an output voltage of the replica circuit, and supplies the generated bias voltage to a cascode element of the amplifier circuit and a cascode element of the replica circuit.

6 Claims, 11 Drawing Sheets

(51) Int. Cl.
  *H03K 3/356* (2006.01)
  *G01J 1/44* (2006.01)
  *H03F 1/30* (2006.01)
  *H03F 3/30* (2006.01)
  *H03F 3/345* (2006.01)

(52) U.S. Cl.
  CPC ....... *H03F 3/345* (2013.01); *H03K 3/356017* (2013.01); *H04B 10/693* (2013.01); *H03F 2200/453* (2013.01)

(56) References Cited

U.S. PATENT DOCUMENTS

| | | | | |
|---|---|---|---|---|
| 5,471,132 A * | 11/1995 | Ryat | ........................ | G05F 3/265 323/315 |
| 6,747,514 B1 * | 6/2004 | Aude | .................. | H03F 3/45188 330/253 |
| 2011/0020011 A1 | 1/2011 | Yazaki | | |

FOREIGN PATENT DOCUMENTS

| JP | 2011-29738 | 2/2011 |
|---|---|---|
| JP | 2017-59981 | 3/2017 |

* cited by examiner

BIAS CIRCUIT WITH A REPLICA CIRCUIT FOR AN AMPLIFIER CIRCUIT AND A GENERATION CIRCUIT SUPPLYING BIAS VOLTAGE TO THE REPLICA AND AMPLIFIER CIRCUITS AND OPTICAL RECEIVER

CROSS-REFERENCE TO RELATED APPLICATION

This application is based upon and claims the benefit of priority of the prior Japanese Patent Application No. 2017-142067, filed on Jul. 21, 2017, the entire contents of which are incorporated herein by reference.

FIELD

The embodiments discussed herein are related to a bias circuit and an optical receiver.

BACKGROUND

Hitherto, an optical logic input circuit that feeds back output of a CMOS inverter to input has been known. CMOS stands for Complementary Metal Oxide Semiconductor. In addition, an amplifier circuit such as TIA using a cascode type CMOS inverter has been known. TIA stands for Transimpedance Amplifier.

However, in the above-described related art, when the characteristics of transistors used in the cascode type CMOS inverter is varied by variation in manufacturing processes, there is the case of decreased the output voltage range of the amplifier circuit using the CMOS inverter. For example, when a threshold voltage of the transistors used in the cascode type CMOS inverter is low, the output voltage range of the amplifier circuit using the CMOS inverter becomes narrow.

The following is a reference document.
[Document 1] Japanese Laid-open Patent Publication No. 63-36612.

SUMMARY

According to an aspect of the invention, a bias circuit includes a replica circuit for an amplifier circuit using a cascode type inverter, and a generation circuit that generates a bias voltage that causes a drain voltage of an input stage transistor of the amplifier circuit to be a saturation drain voltage, based on an output voltage of the replica circuit, and supplies the generated bias voltage to a cascode element of the amplifier circuit and a cascode element of the replica circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments of a bias circuit and an optical receiver according to the present disclosure will be described in detail with reference to the drawings.

Embodiment 1

(Amplifier Circuit and Bias Circuit According to Embodiment 1)

Figure 1:
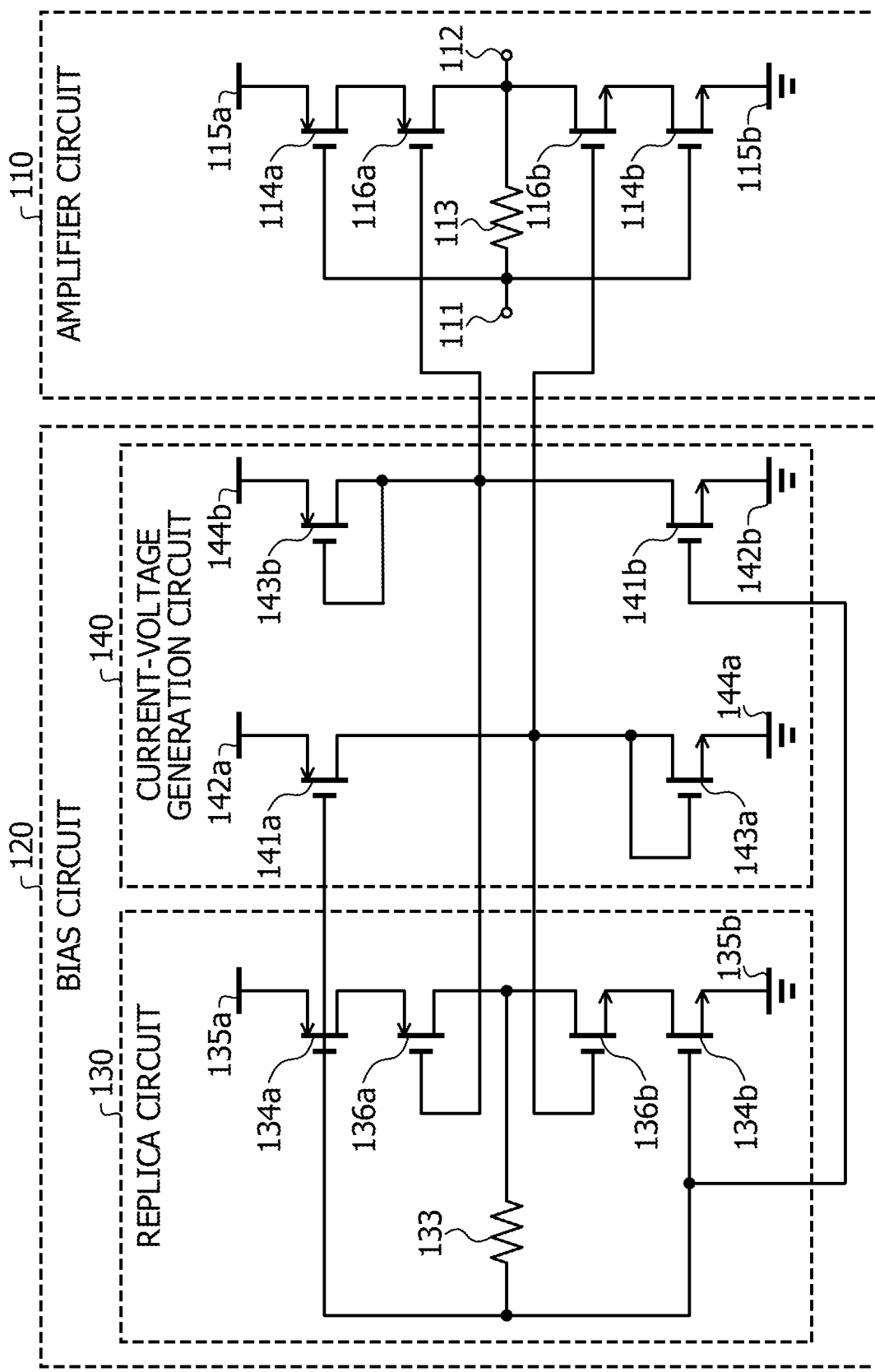
FIG. 1 is a diagram illustrating an example of an amplifier circuit and a bias circuit according to Embodiment 1.

FIG. 1 is a diagram illustrating an example of an amplifier circuit and a bias circuit according to Embodiment 1. An amplifier circuit 110 illustrated in FIG. 1 is an amplifier circuit that is to be biased by a bias circuit 120. For example, the amplifier circuit 110 is a TIA that converts a current signal to a voltage signal. TIA stands for Transimpedance Amplifier. As illustrated in FIG. 1, the amplifier circuit 110 includes an input terminal 111, an output terminal 112, a feedback resistor 113, PMOS transistors 114a and 116a, NMOS transistors 114b and 116b, a constant voltage source 115a, and a ground 115b.

In the amplifier circuit 110, a CMOS inverter is realized by the PMOS transistor 114a and the NMOS transistor 114b. CMOS stands for Complementary Metal Oxide Semiconductor. In addition, in the amplifier circuit 110, the PMOS transistor 116a and the NMOS transistor 116b are provided as cascode elements to the PMOS transistor 114a and the NMOS transistor 114b, respectively. That is, the amplifier circuit 110 is an amplifier circuit using a cascode type CMOS inverter (for example, TIA).

A electric signal that is to be amplified by the amplifier circuit 110 is inputted to the input terminal 111. The output terminal 112 is connected to the input terminal 111 via the feedback resistor 113. The electric signal inputted to the input terminal 111 is amplified and outputted from the output terminal 112.

Each of the PMOS transistor 114a and the NMOS transistor 114b (input stage transistor) is a common source circuit. The source terminal of both transistors is connected to AC ground, the gate terminal of them is connected to an input terminal 111, and the output signals form the transistors are output from drain terminal of them.

For example, the PMOS transistor 114a is a p-type MOSFET that has a source connected to the constant voltage source 115a ($V_{dd}$), a drain connected to the source of the PMOS transistor 116a, and a gate connected to the input terminal 111. MOSFET stands for Metal-Oxide-Semiconductor Field-Effect-Transistor.

The NMOS transistor 114b is an n-type MOSFET that has a source connected to the ground 115b, a drain connected to the source of the NMOS transistor 116b, and a gate connected to the input terminal 111.

Each of the PMOS transistor 116a and the NMOS transistor 116b is a common gate circuit that has a gate as a common terminal, a source as an input terminal, and a drain as an output terminal.

For example, the source of the PMOS transistor 116a is connected to the drain of the PMOS transistor 114a, and the drain of the PMOS transistor 116a is connected to the connection point of the output terminal 112 and the feedback resistor 113. In addition, a bias voltage is inputted from the bias circuit 120 to the gate of the PMOS transistor 116a.

The source of the NMOS transistor 116b is connected to the drain of the NMOS transistor 114b, and the drain of the NMOS transistor 116b is connected to the connection point of the output terminal 112 and the feedback resistor 113. In addition, a bias voltage is inputted from the bias circuit 120 to the gate of the NMOS transistor 116b.

As described above, the amplifier circuit 110 is a cascode amplifier realized by series connection of the common source circuits and the common gate circuits. In such an amplifier circuit 110, for example, when a threshold voltage $V_{th}$ of the PMOS transistor 116a and the NMOS transistor 116b, which are cascode elements, decreases due to manufacturing variations, the output voltage range of the amplifier circuit 110 becomes narrow (see, for example, the second figure from the left of FIG. 3).

The output voltage range becoming narrow means that, for example, the amplitude of the output voltage becomes narrow. The output voltage range becoming wide means that, for example, the amplitude of the output voltage becomes high. Manufacturing variations are variations among wafers when a plurality of amplifier circuits 110 are produced on the wafers in manufacturing processes.

The bias circuit 120 includes a replica circuit 130 and a current-voltage generation circuit 140. The replica circuit 130 is a circuit having the same configuration as the amplifier circuit 110. The circuit having the same configuration as the amplifier circuit 110 is a circuit having the same electric characteristics as the amplifier circuit 110 and is a circuit that is the same as the amplifier circuit 110 in connection relationship of each transistor and the size of each transistor (for example, gate width).

However, the circuit having the same configuration as the amplifier circuit 110 may be a circuit or the like in which the connection relationship of each transistor is the same as that in the amplifier circuit 110 and the size of each transistor is a size obtained by multiplying the size of the transistor of the amplifier circuit 110 by a predetermined value or by dividing the size of the transistor of the amplifier circuit 110 by a predetermined value.

For example, the replica circuit 130 includes a feedback resistor 133, PMOS transistors 134a and 136a, NMOS transistors 134b and 136b, a constant voltage source 135a, and a ground 135b. The respective components of the replica circuit 130 correspond to the feedback resistor 113, the PMOS transistors 114a and 116a, the NMOS transistors 114b and 116b, the constant voltage source 115a, and the ground 115b of the amplifier circuit 110.

The gate of the PMOS transistor 136a of the replica circuit 130 is connected to the gate of the PMOS transistor 116a of the amplifier circuit 110. In addition, the gate of the NMOS transistor 136b of the replica circuit 130 is connected to the gate of the NMOS transistor 116b of the amplifier circuit 110.

The current-voltage generation circuit 140 generates a current and a voltage from the output voltage of the replica circuit 130. Then, the current-voltage generation circuit 140 supplies the generated voltage to the respective gates of the PMOS transistor 116a and the NMOS transistor 116b of the amplifier circuit 110.

For example, the current-voltage generation circuit 140 includes a PMOS transistor 141a, a NMOS transistor 141b, constant voltage sources 142a and 144b, grounds 142b and 144a, a diode connected NMOS 143a, and a diode connected PMOS 143b.

A bias voltage that is to be supplied to the gate of the NMOS transistor 116b, which is an n-channel cascode element in the amplifier circuit 110, is generated by the PMOS transistor 141a and the diode connected NMOS 143a.

The PMOS transistor 141a is a p-type MOSFET having the same size as the PMOS transistor 114a. In addition, the source of the PMOS transistor 141a is connected to the constant voltage source 142a ($V_{dd}$), and the drain of the PMOS transistor 141a is connected to the drain of the diode connected NMOS 143a. In addition, the gate of the PMOS transistor 141a is connected to the gate of the PMOS transistor 134a.

The diode connected NMOS 143a is an n-type MOSFET that has a source connected to the ground 144a and a drain connected to the gate thereof and the drain of the PMOS transistor 141a. In addition, the size of the diode connected NMOS 143a is set to, for example, ¼ times of the size of the NMOS transistor 134b and the NMOS transistor 136b of the replica circuit 130.

The connection point of the PMOS transistor 141a and the diode connected NMOS 143a is connected to the gate of the NMOS transistor 136b of the replica circuit 130. In addition, the connection point of the PMOS transistor 141a and the diode connected NMOS 143a is connected as a bias supply source to the gate of the NMOS transistor 116b.

A bias voltage that is to be supplied to the gate of the PMOS transistor 116a, which is the p-channel cascode element in the amplifier circuit 110, is generated by the NMOS transistor 141b and the diode connected PMOS 143b.

The NMOS transistor 141b is an n-type MOSFET having the same size as the NMOS transistor 114b. In addition, the source of the NMOS transistor 141b is connected to the ground 142b, and the drain of the NMOS transistor 141b is connected to the drain of the diode connected PMOS 143b. Moreover, the gate of the NMOS transistor 141b is connected to the gate of the NMOS transistor 134b.

The diode connected PMOS 143b is a p-type MOSFET that has a source connected to the constant voltage source 144b ($V_{dd}$) and a drain connected to the gate thereof and the drain of the NMOS transistor 141b. In addition, the size of the diode connected PMOS 143b is set to, for example, ¼ times of the size of the PMOS transistor 134a and the PMOS transistor 136a of the replica circuit 130.

The connection point of the NMOS transistor 141b and the diode connected PMOS 143b is connected to the gate of the PMOS transistor 136a of the replica circuit 130. In addition, the connection point of the NMOS transistor 141b and the diode connected PMOS 143b is connected as a bias supply source to the gate of the PMOS transistor 116a.

(Operation of Bias Circuit According to Embodiment 1)

Figure 2:
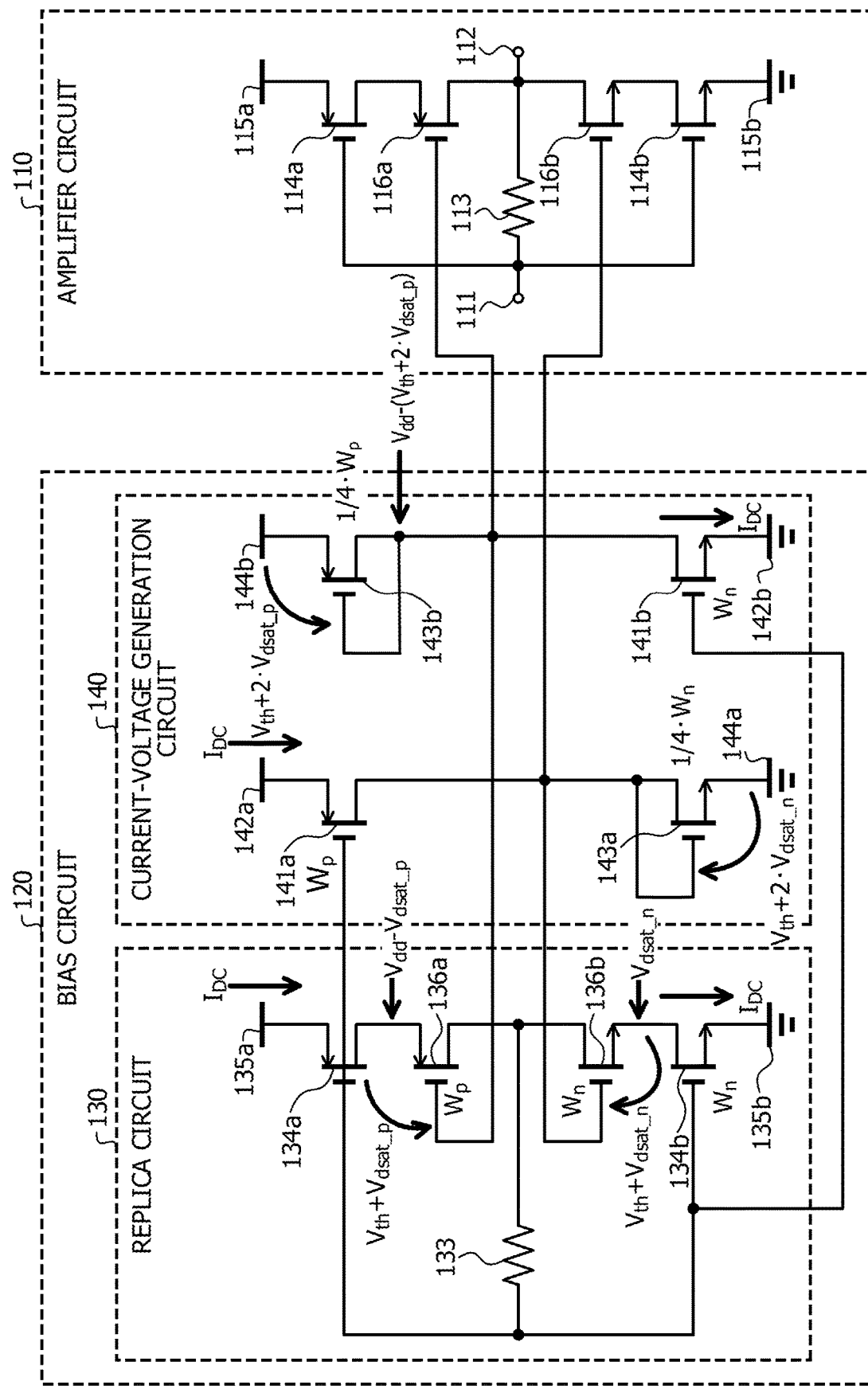
FIG. 2 is a diagram illustrating an example of operation of the bias circuit according to Embodiment 1.

FIG. 2 is a diagram illustrating an example of operation of the bias circuit according to Embodiment 1. In FIG. 2, the same parts as those illustrated in FIG. 1 are designated by the same reference characters, and the description thereof is omitted. In addition, the gate widths of the PMOS transistor 114a, the PMOS transistor 116a, the PMOS transistor 134a, the PMOS transistor 136a, and the PMOS transistor 141a are $W_p$. In this case, the gate width of the diode connected PMOS 143b is $(\frac{1}{4}) \cdot W_p$. In addition, the gate widths of the NMOS transistor 114b, the NMOS transistor 116b, the NMOS transistor 134b, the NMOS transistor 136b, and the NMOS transistor 141b are $W_n$. In this case, the gate width of the diode connected NMOS 143a is $(\frac{1}{4}) \cdot W_n$.

The range of the output voltage from the output terminal 112 of the amplifier circuit 110 becomes narrower as the drain voltages of the PMOS transistor 114a and the NMOS transistor 114b, which are the input stage transistors, increase.

Meanwhile, a saturation drain voltage $V_{dsat\_n}$ which is a minimum drain voltage only has to be supplied to the NMOS transistor 114b in order to operate the NMOS transistor 114b, which is the input stage transistor, in the saturation region. Similarly, a saturation drain voltage $V_{dd}-V_{dsat\_p}$ only has to be supplied to the PMOS transistor 114a in order to operate the PMOS transistor 114a, which is the input stage transistor, in the saturation region. The saturation drain voltage is, for example, a minimum drain voltage at which a drain current is saturated.

That is, when the drain voltage of the NMOS transistor 114b is set to $V_{dsat\_n}$, the NMOS transistor 114b operates in the saturation region, and the output voltage range of the amplifier circuit 110 is extended. In addition, when the drain voltage of the PMOS transistor 114a is set to $V_{dd}-V_{dsat\_p}$, the PMOS transistor 114a operates in the saturation region, and the output voltage range of the amplifier circuit 110 is extended.

The bias circuit 120 generates a bias voltage such that the drain voltage of the NMOS transistor 114b is $V_{dsat\_n}$ and the drain voltage of the PMOS transistor 114a is $V_{dd}-V_{dsat\_p}$.

The replica circuit 130 has the same configuration as the amplifier circuit 110, which is to be biased, and thus the current flowing in the replica circuit 130 is equal to that in the amplifier circuit 110.

The gate-source voltage of the PMOS transistor 141a in the current-voltage generation circuit 140 is equal to the gate-source voltage of the PMOS transistor 134a in the replica circuit 130. Thus, a DC current $I_{DC}$ (direct current) flowing in the current-voltage generation circuit 140 is equal to a DC current $I_{DC}$ flowing in the replica circuit 130, that is, equal to a DC current flowing in the amplifier circuit 110.

The size of the transistor of the diode connected NMOS 143a is $(\frac{1}{4}) \cdot W_n$, which is ¼ of the size of the NMOS transistors 134b and 136b of the replica circuit 130. Accordingly, a voltage of $V_{th}+2 \cdot V_{dsat\_n}$ is generated in the diode connected NMOS 143a.

The voltage of $V_{th}+2 \cdot V_{dsat\_n}$ generated in the diode connected NMOS 143a is applied to the gate of the NMOS transistor 136b, which is the cascode element of the replica circuit 130. In addition, the gate-source voltage of the NMOS transistor 136b is $V_{th}+V_{dsat\_n}$. Thus, the drain voltage of the NMOS transistor 134b is set to $(V_{th}+2 \cdot V_{dsat\_n})-(V_{th}+V_{dsat\_n})=V_{dsat\_n}$.

Accordingly, it is possible to set the drain voltage of the NMOS transistor 114b, which is the input stage transistor in the amplifier circuit 110 having the same configuration as the replica circuit 130, to $V_{dsat\_n}$. Therefore, the NMOS transistor 114b operates in the saturation region, and the lower limit of the output voltage range of the amplifier circuit 110 is lowered.

Similarly, the size of the transistor of the diode connected PMOS 143b is $(\frac{1}{4}) \cdot W_p$, which is ¼ of the size of the PMOS transistors 134a and 136a of the replica circuit 130. Accordingly, a voltage of $V_{dd}-(V_{th}+2 \cdot V_{dsat\_p})$ is generated in the diode connected PMOS 143b.

The voltage of $V_{dd}-(V_{th}+2 \cdot V_{dsat\_p})$ generated in the diode connected PMOS 143b is applied to the gate of the PMOS transistor 136a, which is the cascode element of the replica circuit 130. In addition, the gate-source voltage of the PMOS transistor 136a is $V_{th}+V_{dsat\_p}$. Thus, the drain voltage of the PMOS transistor 134a is set to $(V_{dd}-(V_{th}+2 \cdot V_{dsat\_p}))+(V_{th}+V_{dsat\_p})=V_{dd}-V_{dsat\_p}$.

Accordingly, it is possible to set the drain voltage of the PMOS transistor 114a, which is the input stage transistor in the amplifier circuit 110 having the same configuration as the replica circuit 130, to $V_{dd}-V_{dsat\_p}$. Therefore, the PMOS transistor 114a operates in the saturation region, and the upper limit of the output voltage range of the amplifier circuit 110 is raised.

(Signal Output Range of Amplifier Circuit According to Embodiment 1)

Figure 3:
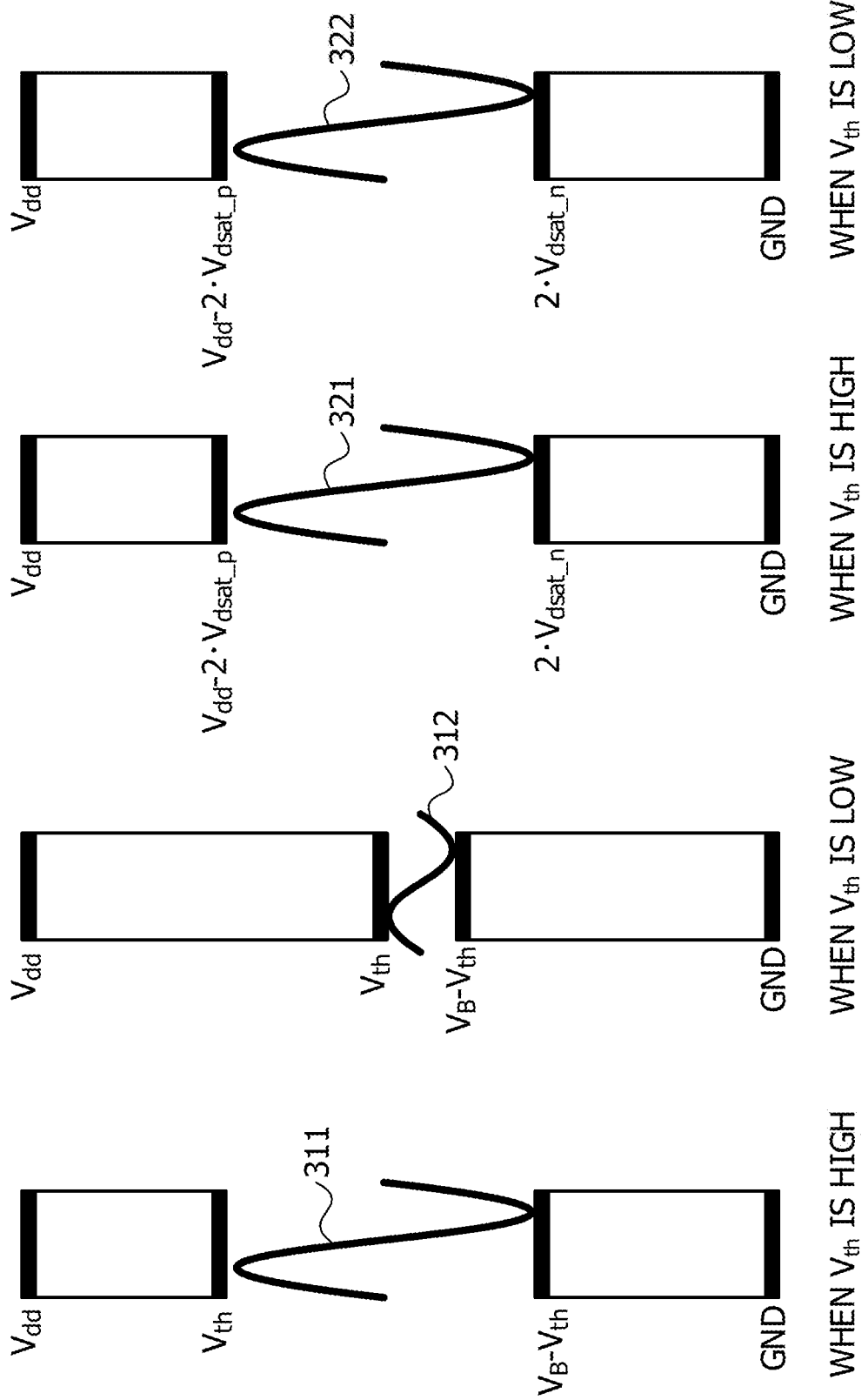
FIG. 3 is a diagram illustrating an example of a signal output range of the amplifier circuit according to Embodiment 1.

FIG. 3 is a diagram illustrating an example of the signal output range of the amplifier circuit according to Embodiment 1. In FIG. 3, the vertical axis indicates voltage. GND in FIG. 3 indicates ground. As signals 311 and 312, signals outputted from the output terminal 112 if a constant bias voltage $V_B$ is applied to the respective gates of the PMOS transistor 116a and the NMOS transistor 116b are illustrated for reference.

As the signal 311, a signal outputted from the output terminal 112 when the threshold voltage $V_{th}$ of the PMOS transistor 116a and the NMOS transistor 116b, which are the cascode elements, is relatively high due to manufacturing variations, is illustrated for reference. In addition, as the signal 312, a signal outputted from the output terminal 112 when the threshold voltage $V_{th}$ of the PMOS transistor 116a and the NMOS transistor 116b, which are the cascode elements, is relatively low due to manufacturing variations, is illustrated for reference.

For the signals 311 and 312 outputted when the constant bias voltage $V_B$ is applied to the respective gates of the PMOS transistor 116a and the NMOS transistor 116b, the upper limit voltage is $V_{th}$, and the lower limit voltage is $V_B-V_{th}$. Therefore, when $V_{th}$ is low, the range of the signals 311 and 312 becomes narrow.

As signals 321 and 322, signals outputted from the output terminal 112 when the bias voltage $V_B$ is applied from the bias circuit 120 to the respective gates of the PMOS transistor 116a and the NMOS transistor 116b are illustrated. In addition, as the signal 321, a signal outputted from the output terminal 112 when the threshold voltage $V_{th}$ of the PMOS transistor 116a and the NMOS transistor 116b, which are the cascode elements, is relatively high due to manufacturing variations, is illustrated. In addition, as the signal 322, a signal outputted from the output terminal 112 when the threshold voltage $V_{th}$ of the PMOS transistor 116a and the NMOS transistor 116b, which are the cascode elements, is relatively low due to manufacturing variations, is illustrated.

As described above, by using the bias circuit 120, $V_{dd}-(V_{th}+2\cdot V_{dsat\_p})$ is applied as a bias voltage to the gate of the PMOS transistor 116a. In addition, by using the bias circuit 120, $V_{th}+2\cdot V_{dsat\_n}$ is applied as a bias voltage to the gate of the NMOS transistor 116b.

In this case, for the signals 321 and 322, the upper limit voltage is $V_{dd}-2\cdot V_{dsat\_p}$, and the lower limit voltage is $2\cdot V_{dsat\_n}$. Therefore, since the range of the signals 321 and 322 is not influenced by $V_{th}$, even when $V_{th}$ is decreased due to manufacturing variations, the range of the signals 321 and 322 does not become narrow. Generally, $V_{th} \gg V_{dsat\_p}$ and $V_{th} \gg V_{dsat\_n}$.

(Adjustment of Saturation Drain Voltage Based on Size of Transistor According to Embodiment 1)

Figure 4:
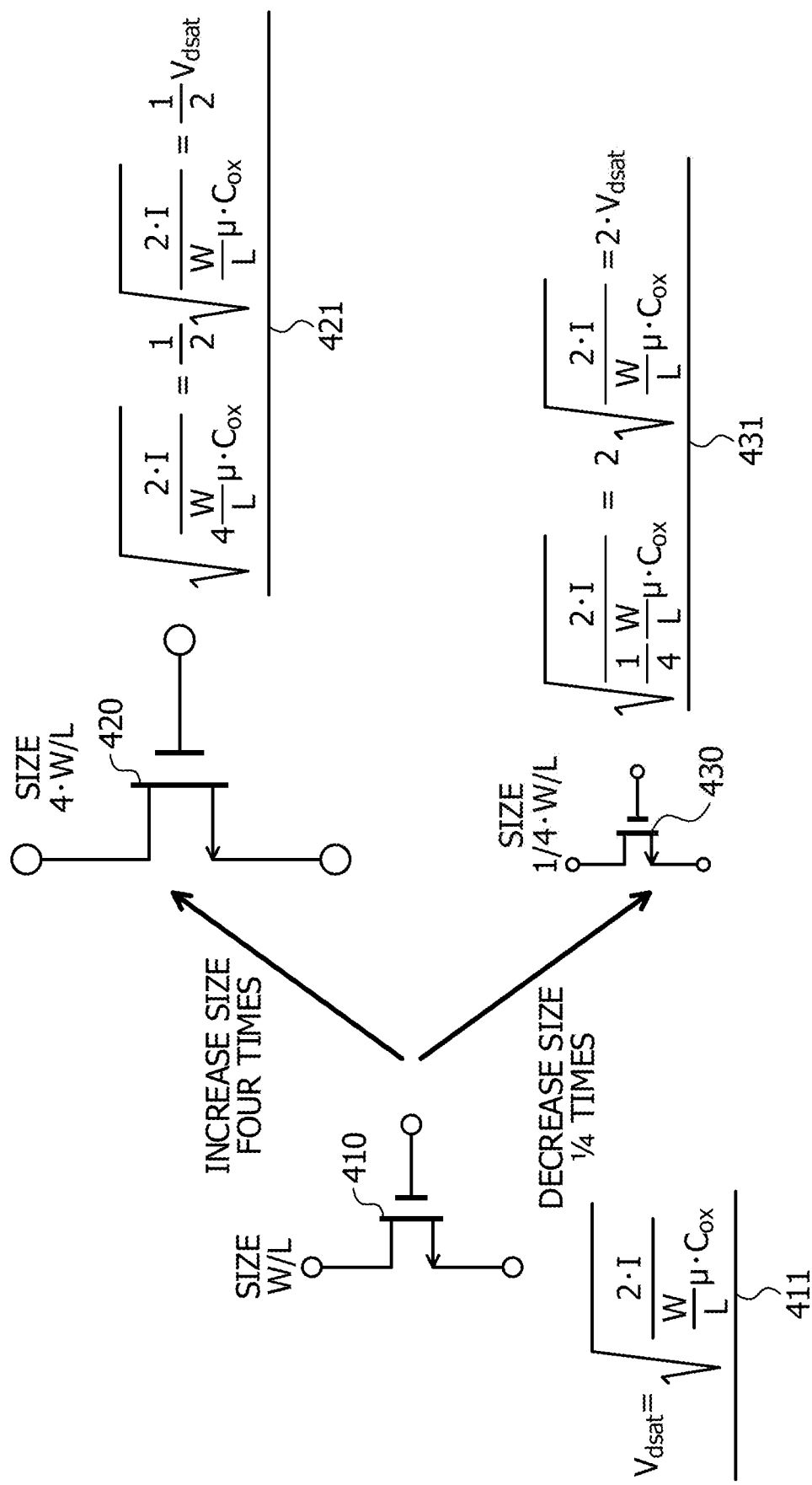
FIG. 4 is a diagram illustrating an example of adjustment of a saturation drain voltage based on the size of a transistor according to Embodiment 1.

FIG. 4 is a diagram illustrating an example of adjustment of a saturation drain voltage based on the size of a transistor according to Embodiment 1. A transistor 410 illustrated in FIG. 4 is a transistor having a size of W/L. W denotes the gate width of the transistor, and L denotes the gate length of the transistor. When the saturation drain voltage of the transistor 410 is $V_{dsat}$, it is possible to represent $V_{dsat}$ as in formula 411. In formula 411, I indicates DC current, μ indicates mobility of electrons in a semiconductor, and $C_{ox}$ indicates oxide film capacitance.

A transistor 420 illustrated in FIG. 4 is a transistor obtained by setting the size of the transistor 410 to be four times, that is, a transistor having a size of 4·W/L. It is possible to represent the saturation drain voltage of the transistor 420 as in formula 421. That is, the saturation drain voltage of the transistor 420 is $(½)\cdot V_{dsat}$, which is ½ times of the saturation drain voltage of the transistor 410. As described above, when the size (gate width/gate length) of the transistor is set to be four times, it is possible to set the saturation drain voltage to be ½ times.

A transistor 430 illustrated in FIG. 4 is a transistor obtained by setting the size of the transistor 410 to be ¼ times, that is, a transistor having a size of (¼)·W/L. It is possible to represent the saturation drain voltage of the transistor 430 as in formula 431. That is, the saturation drain voltage of the transistor 430 is $2\cdot V_{dsat}$, which is two times of the saturation drain voltage of the transistor 410. As described above, when the size (gate width/gate length) of the transistor is set to be ¼ times, it is possible to set the saturation drain voltage to be two times.

For example, the transistor 410 illustrated in FIG. 4 may be used as each transistor different from the diode connected NMOS 143a and the diode connected PMOS 143b, among the respective transistors illustrated in FIGS. 1 and 2. For example, the transistor 430 illustrated in FIG. 4 may be used as each of the transistors of the diode connected NMOS 143a and the diode connected PMOS 143b, among the respective transistors illustrated in FIGS. 1 and 2.

As illustrated in FIG. 4, it is possible to adjust the saturation drain voltage based on the size (gate width/gate length) of the transistor. For example, the case of adjusting the size of the transistor based on the gate width has been described with reference to FIG. 2, but the size of the transistor may be adjusted based on the gate length, or may be adjusted based on both the gate width and the gate length.

(Adjustment of Saturation Drain Voltage Based on Current of Transistor According to Embodiment 1)

Figure 5:
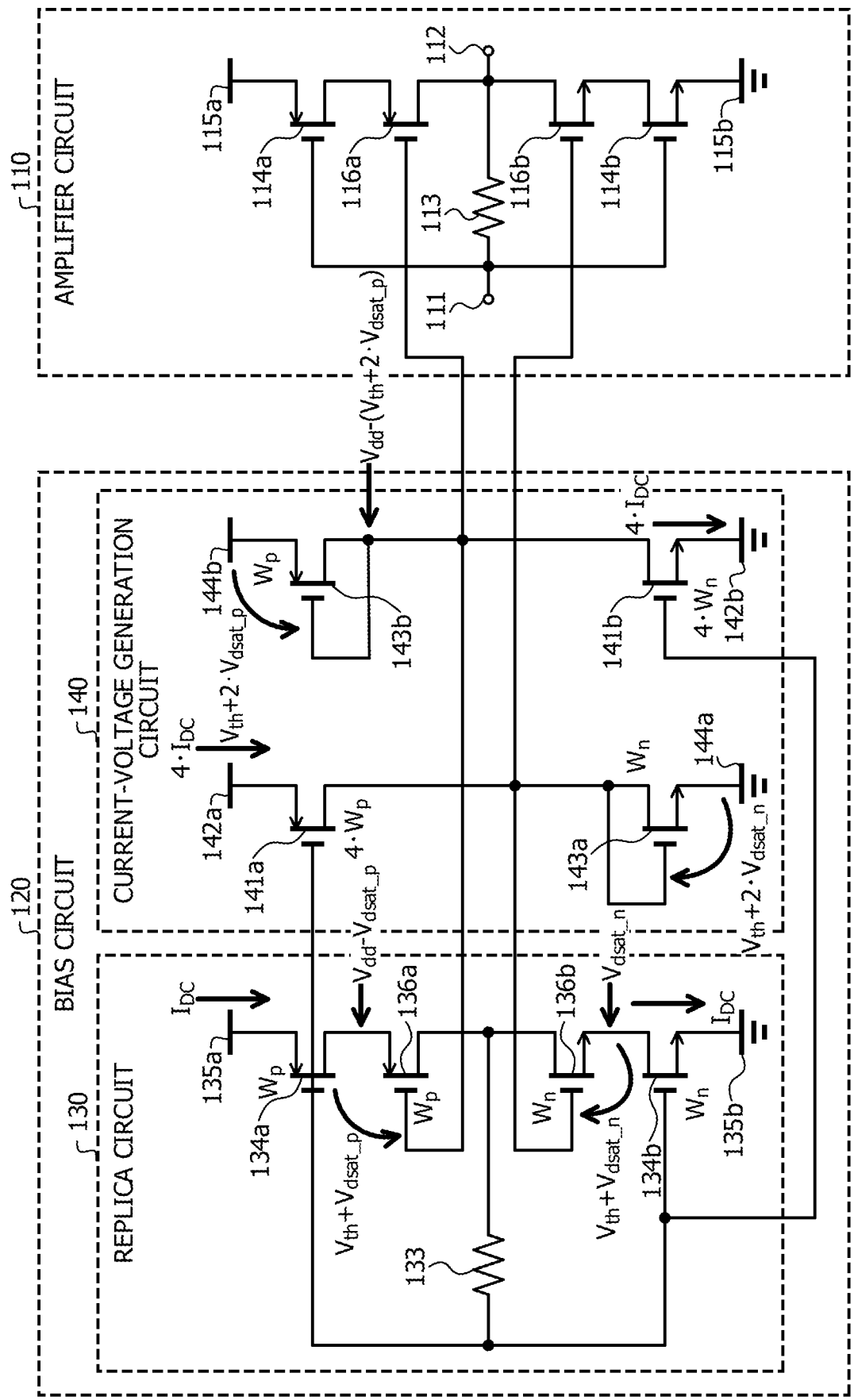
FIG. 5 is a diagram illustrating an example of adjustment of a saturation drain voltage based on a current of the transistor according to Embodiment 1.

FIG. 5 is a diagram illustrating an example of adjustment of a saturation drain voltage based on a current of a transistor according to Embodiment 1. In FIG. 5, the same parts as those illustrated in FIG. 2 are designated by the same reference characters, and the description thereof is omitted.

As illustrated in FIG. 5, a DC current flowing through the PMOS transistor 141a may be set to $4\cdot I_{DC}$, which is four times of the DC current $I_{DC}$ flowing in the replica circuit 130. In this case, the size of the PMOS transistor 141a is set to be $4\cdot W_p$, which is four times of the size $W_p$ of the PMOS transistor 134a and the PMOS transistor 136a. In addition, the size of the transistor of the diode connected NMOS 143a is set to be equal to the size $W_n$ of the NMOS transistor 134b and the NMOS transistor 136b.

A DC current flowing through the NMOS transistor 141b may be set to $4\cdot I_{DC}$, which is four times of the DC current $I_{DC}$ flowing in the replica circuit 130. In this case, the size of the NMOS transistor 141b is set to $4\cdot W_n$, which is four times of the size $W_n$ of the NMOS transistor 134b and the NMOS transistor 136b. In addition, the size of the transistor of the diode connected PMOS 143b is set to be equal to the size $W_p$ of the PMOS transistor 134a and the PMOS transistor 136a.

As illustrated in FIG. 5, by the transistors and the DC currents, it is possible to set the saturation drain voltage of the diode connected NMOS 143a and the diode connected PMOS 143b to be $2\cdot V_{dsat}$. For example, the transistor 410 illustrated in FIG. 4 may be used as each of the transistors of the diode connected NMOS 143a and the diode connected PMOS 143b, among the respective transistors illustrated in FIG. 5. For example, the transistor 420 illustrated in FIG. 4 may be used as each of the PMOS transistor 141a and the NMOS transistor 141b among the respective transistors illustrated in FIG. 5.

(Expansion of Output Signal Range by Bias Circuit According to Embodiment 1)

Figure 6:
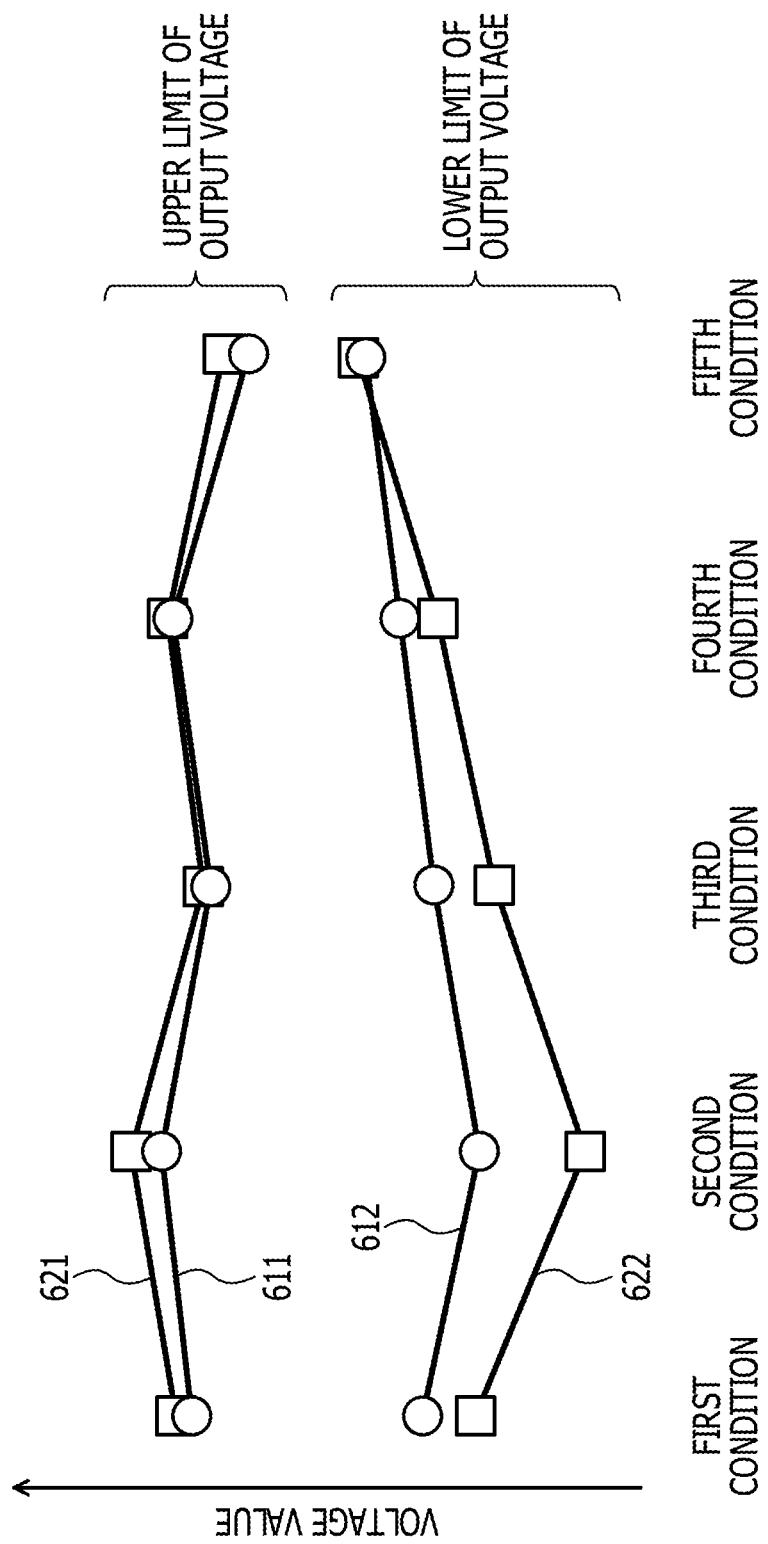
FIG. 6 is a diagram illustrating an example of expansion of an output signal range by the bias circuit according to Embodiment 1.

FIG. 6 is a diagram illustrating an example of expansion of an output signal range by the bias circuit according to Embodiment 1. In FIG. 6, the vertical axis indicates a voltage value of a signal outputted from the output terminal 112 of the amplifier circuit 110. First to fifth conditions in the lateral direction are different combinations of the performance of transistors, a power source voltage, and a junction temperature.

As an upper limit of output voltage 611, a simulation result of the upper limit of the voltage value of a signal outputted from the output terminal 112 if a constant bias voltage is applied to each of the gates of the PMOS transistor 116a and the NMOS transistor 116b is illustrated for reference. As a lower limit of output voltage 612, a simulation result of the lower limit of the voltage value of a signal outputted from the output terminal 112 if a constant bias voltage is applied to each of the gates of the PMOS transistor 116a and the NMOS transistor 116b is illustrated for reference.

An upper limit of output voltage 621 indicates a simulation result of the upper limit of the voltage value of a signal outputted from the output terminal 112 when a bias voltage is applied from the bias circuit 120 to each of the gates of the PMOS transistor 116a and the NMOS transistor 116b. A lower limit of output voltage 622 indicates a simulation result of the lower limit of the voltage value of the signal outputted from the output terminal 112 when a bias voltage is applied from the bias circuit 120 to each of the gates of the PMOS transistor 116a and the NMOS transistor 116b.

When the upper limit of output voltage 611 and the lower limit of output voltage 612, and the upper limit of output voltage 621 and the lower limit of output voltage 622 are compared to each other, it appears that the output voltage range of the amplifier circuit 110 is extended by using the bias circuit 120 even if the performance of the transistors is varied.

(Optical Receiver Including Bias Circuit According to Embodiment 1)

Figure 7:
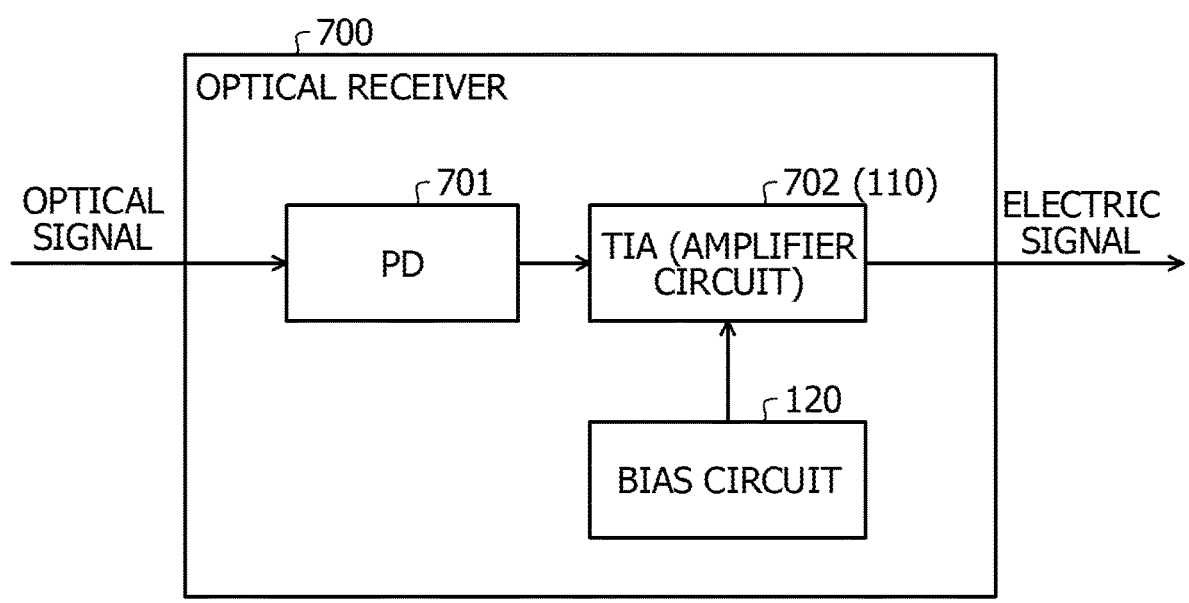
FIG. 7 is a diagram illustrating an example of an optical receiver including the bias circuit according to Embodiment 1.

FIG. 7 is a diagram illustrating an example of an optical receiver including the bias circuit according to Embodiment 1. In FIG. 7, the same parts as those illustrated in FIGS. 1, 2, and 5 are designated by the same reference characters, and the description thereof is omitted. The optical receiver 700 illustrated in FIG. 7 includes a PD 701, a TIA 702, and a bias circuit 120. PD stands for Photo Detector. TIA stands for Transimpedance Amplifier.

The PD 701 converts an inputted optical signal to an electric signal (current signal). Then, the PD 701 outputs the electric signal resulting from the conversion, to the TIA 702. The TIA 702 converts the electric signal outputted from the PD 701, from the current signal to a voltage signal. Then, the TIA 702 outputs the electric signal resulting from the conversion. In addition, the TIA 702 is a circuit that is to be biased by the bias circuit 120, and is the aforementioned amplifier circuit 110, for example.

The bias circuit 120 supplies, for example, the aforementioned bias voltage to the gate of the cascode element (for example, the PMOS transistor 116a and the NMOS transistor 116b of the amplifier circuit 110) of the TIA 702. Accordingly, it is possible to widen the output signal range of the TIA 702 and output a high-quality electric signal.

(Optical Module Including Optical Receiver According to Embodiment 1)

Figure 8:
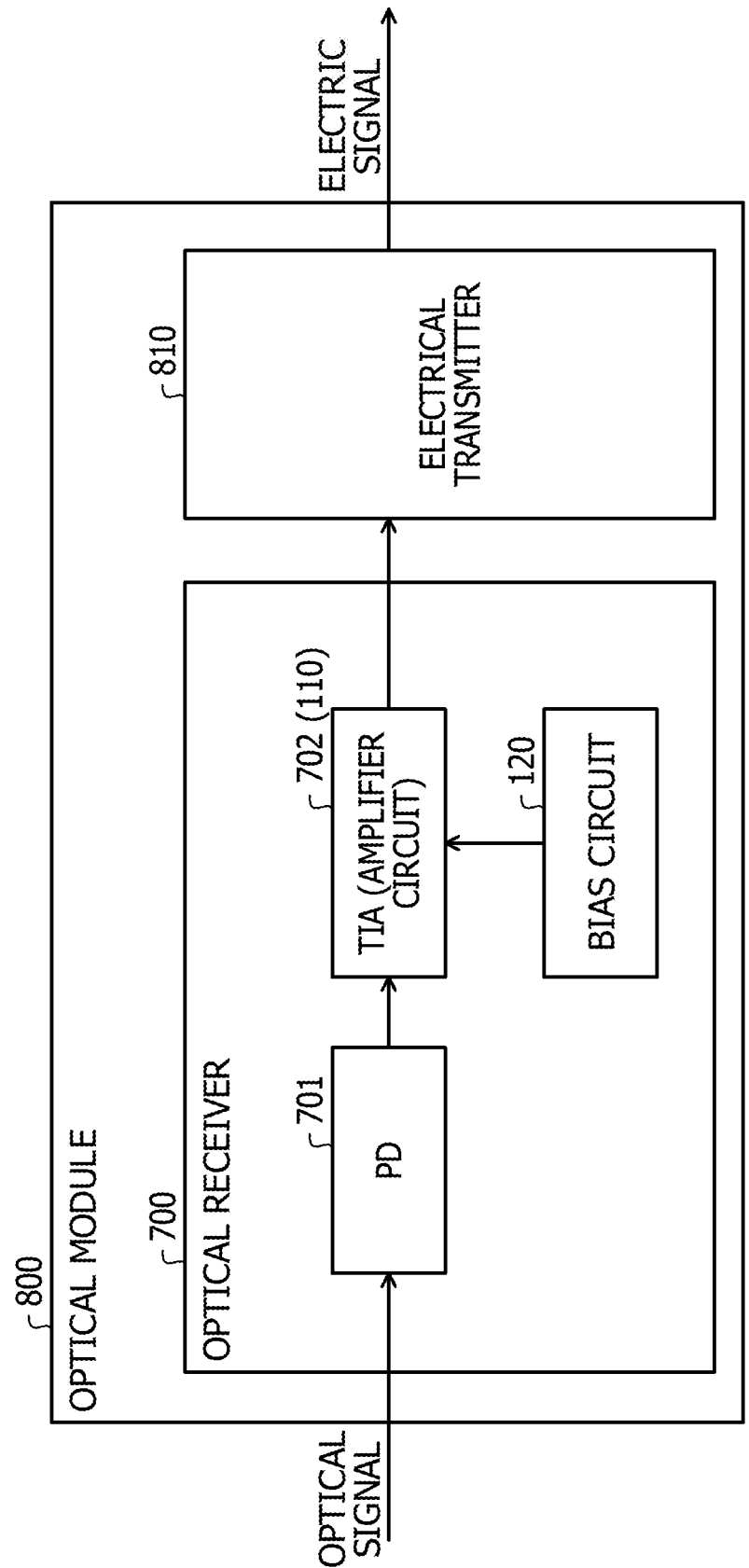
FIG. 8 is a diagram illustrating an example of an optical module including the optical receiver according to Embodiment 1.

FIG. 8 is a diagram illustrating an example of an optical module including the optical receiver according to Embodiment 1. In FIG. 8, the same parts as those illustrated in FIG. 7 are designated by the same reference characters, and the description thereof is omitted. The optical module 800 illustrated in FIG. 8 includes an optical receiver 700 and an electrical transmitter 810. The TIA 702 of the optical receiver 700 outputs an electric signal resulting from conversion, to the electrical transmitter 810.

The electrical transmitter 810 processes the electric signal outputted from the TIA 702. Then, the electrical transmitter 810 transmits the processed electric signal. The processing of the electric signal by the electrical transmitter 810 is, for example, identification (decoding) of the electric signal, or conversion of the electric signal from an analogue signal to a digital signal. Alternatively, the processing of the electric signal may include conversion of the electric signal from a serial signal to a parallel signal.

The optical module 800 illustrated in FIG. 8 is usable, for example, as a high-speed interconnect circuit used for data communication such as data communication between servers, data communication between modules, and data communication of a CPU, or usable for various optical communications. The CPU stands for Central Processing Unit.

(Configuration Using One Chip Circuit of Optical Module According to Embodiment 1)

Figure 9:
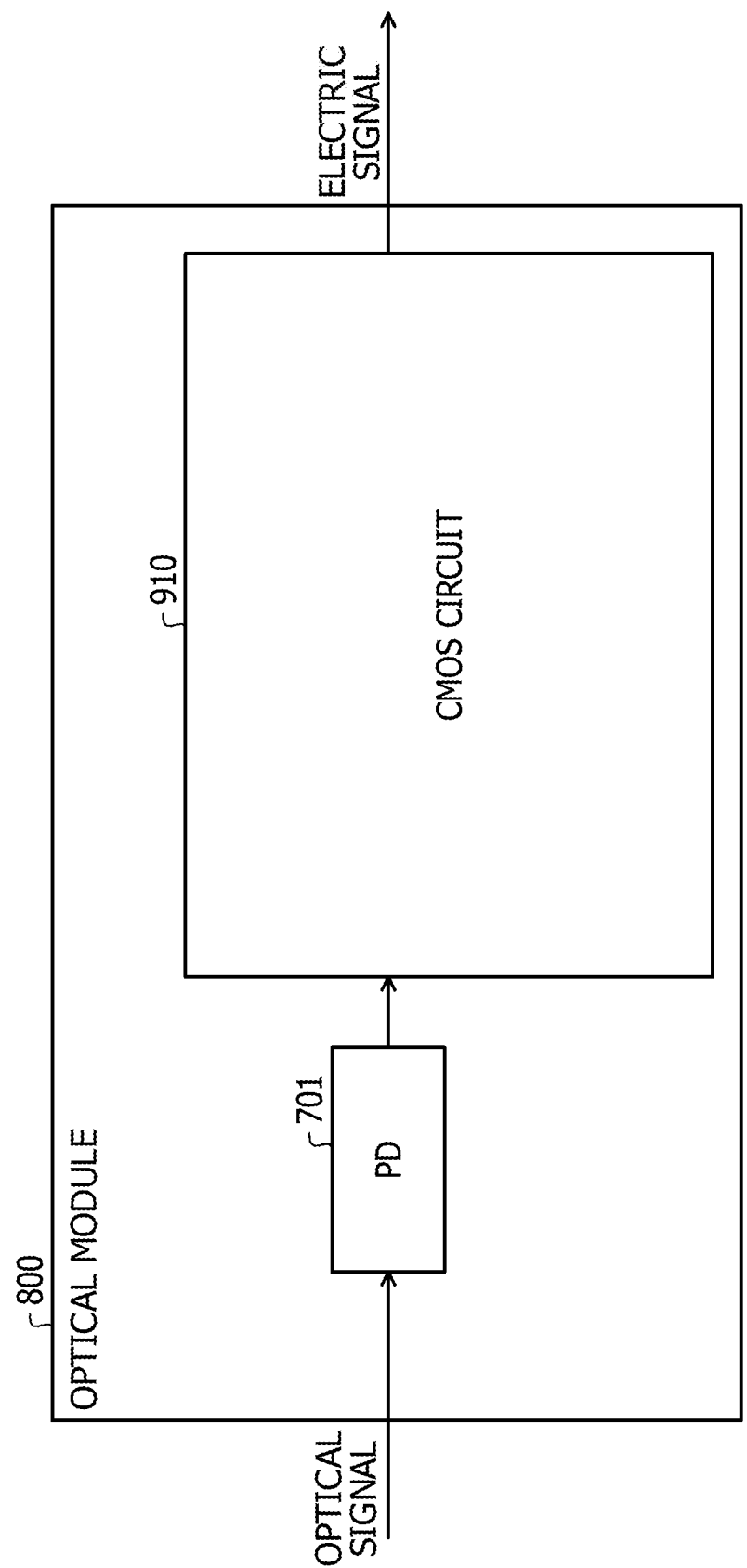
FIG. 9 is a diagram illustrating an example of a configuration using one chip circuit of the optical module according to Embodiment 1.

FIG. 9 is a diagram illustrating an example of a configuration of one chip circuit of the optical module according to Embodiment 1. The optical module 800 illustrated in FIG. 8 may be realized, for example, by a PD 701 and a CMOS circuit 910 as illustrated in FIG. 9. The PD 701 outputs an electric signal resulting from conversion, to the CMOS circuit 910.

The CMOS circuit 910 is a circuit obtained by including the TIA 702, the bias circuit 120, and the electrical transmitter 810 illustrated in FIG. 8, in one chip. As illustrated in FIG. 9, the optical module 800 may be configured such that each electrical circuit illustrated in FIG. 8 is realized in one chip. It is noted that the configuration of the optical module 800 is not limited to such a configuration, and, for example, each electrical circuit illustrated in FIG. 8 may be realized by a plurality of electrical circuits.

As described above, the bias circuit 120 according to Embodiment 1 includes the replica circuit 130 for the amplifier circuit 110 which is a cascode type inverter. In addition, the bias circuit 120 generates a bias voltage for the cascode element (the PMOS transistor 116a and the NMOS transistor 116b) of the amplifier circuit 110 based on the output voltage of the replica circuit 130.

At this time, the bias circuit 120 generates a bias voltage that causes the drain voltage of the transistor at the input stage (the PMOS transistor 114a and the NMOS transistor 114b) of the amplifier circuit 110 to be a saturation drain voltage. Then, the bias circuit 120 supplies the generated bias voltage to the cascode element of the amplifier circuit 110 and the cascode element (the PMOS transistor 136a and the NMOS transistor 136b) of the replica circuit.

Accordingly, the output voltage range of the amplifier circuit 110 no longer depends on the threshold voltage of the cascode element (the PMOS transistor 116a and the NMOS transistor 116b) of the amplifier circuit 110. Thus, even when the performance of the transistors of the amplifier circuit 110 is varied, it is possible to inhibit the output voltage range of the amplifier circuit 110 from becoming narrow.

The amplifier circuit 110 may be composed of a TIA, for example. Accordingly, for example, it is possible to convert an electric signal resulting from conversion of inputted optical signal by the PD 701, from a current signal to a voltage signal, and inhibit the voltage range of the signal resultant from the conversion, from becoming narrow. Thus, for example, it is possible to identify the voltage signal with high accuracy.

The current-voltage generation circuit 140 which generates a bias voltage includes, for example, a MOS transistor having a gate connected to the gate of the input stage transistor of the replica circuit 130, and a diode connected MOS connected to the MOS transistor. The MOS transistor of the current-voltage generation circuit 140 is, for example, the aforementioned PMOS transistor 141a or NMOS transistor 141b. The diode connected MOS of the current-voltage generation circuit 140 is, for example, the aforementioned diode connected NMOS 143a or diode connected PMOS 143b. The connection point of the MOS transistor of the current-voltage generation circuit 140, the diode connected MOS of the current-voltage generation circuit 140, and the gate of the cascode element of the replica circuit 130 are connected to the gate of the cascode element of the amplifier circuit 110.

The saturation drain voltage of the MOS transistor of the current-voltage generation circuit 140 is equal to the saturation drain voltage of the input stage transistor and the cascode element of the replica circuit 130. In addition, the saturation drain voltage of the diode connected MOS of the current-voltage generation circuit 140 is two times of the saturation drain voltage of the input stage transistor and the cascode element of the replica circuit 130. Accordingly, it is possible to generate a bias voltage that causes the drain voltage of the input stage transistor of the amplifier circuit 110 to be the saturation drain voltage.

Embodiment 2

Regarding Embodiment 2, the differences from Embodiment 1 will be described. In Embodiment 2, a configuration for adjusting a potential at an output point of a bias voltage within a predetermined range will be described.

(Amplifier Circuit and Bias Circuit According to Embodiment 2)

Figure 10:
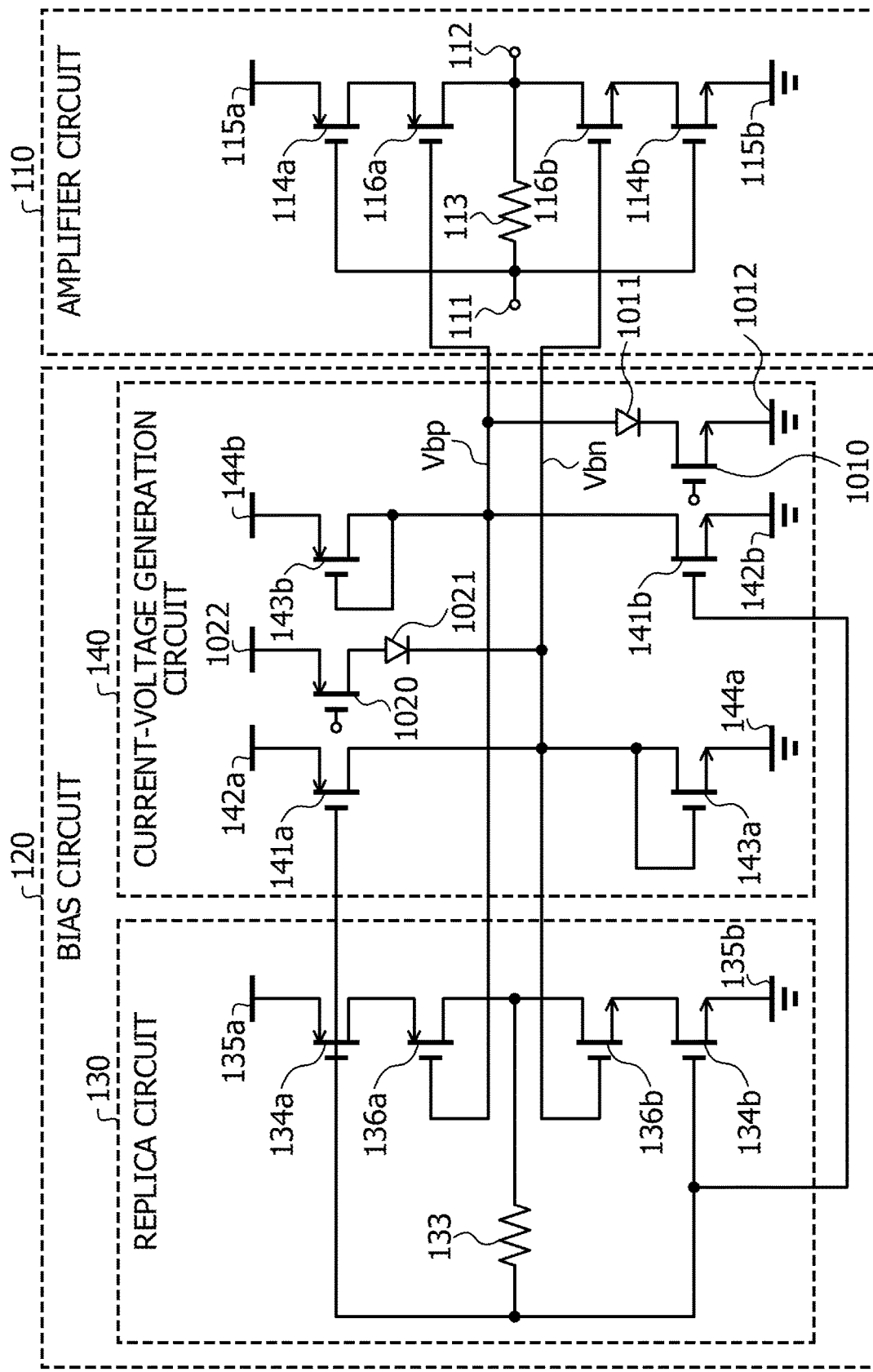
FIG. 10 is a diagram illustrating an example of an amplifier circuit and a bias circuit according to Embodiment 2.

FIG. 10 is a diagram illustrating an example of an amplifier circuit and a bias circuit according to Embodiment 2. In FIG. 10, the same parts as those illustrated in FIG. 1 are designated by the same reference characters, and the description thereof is omitted. As illustrated in FIG. 10, a current-voltage generation circuit 140 of a bias circuit 120 according to Embodiment 2 includes switches 1010 and 1020, a ground diode 1011, a ground 1012, a power source diode 1021, and a constant voltage source 1022 in addition to the configuration illustrated in FIG. 1.

When the potential at an output point Vbp of a bias voltage to the PMOS transistor 116a in the bias circuit 120 is excessively high, the PMOS transistor 136a and the diode connected PMOS 143b may be turned off, so that the bias circuit 120 may not normally operate. On the other hand, by connecting the switch 1010 and the ground diode 1011 between the output point Vbp of the bias voltage and the ground 1012, it is possible to inhibit the potential at the output point Vbp of the bias voltage from being excessively high.

Accordingly, for example, when an ON voltage in the forward direction of the ground diode 1011 is 0.6 [V], if the potential at the output point Vbp of the bias voltage becomes equal to or higher than 0.6 [V] in a state where the switch 1010 is ON, the ground diode 1011 is turned on and a current flows in a direction to the ground. Thus, by setting the upper limit potential at the output point Vbp of the bias voltage to 0.6 [V], it is possible to inhibit the bias circuit 120 from failing to normally operate.

When the potential at an output point Vbn of a bias voltage to the NMOS transistor 116b in the bias circuit 120 is excessively low, the NMOS transistor 136b and the diode connected NMOS 143a may be turned off, so that the bias circuit 120 may not normally operate. On the other hand, by connecting the switch 1020 and the power source diode 1021 between the output point Vbn of the bias voltage and the constant voltage source 1022, it is possible to inhibit the potential at the bias Vbn from being excessively low.

Accordingly, for example, when an ON voltage in the forward direction of the power source diode 1021 is 0.6 [V], if the potential at the output point Vbn of the bias voltage becomes equal to or lower than $V_{dd}$–0.6 [V] in a state where the switch 1020 is ON, the power source diode 1021 is turned on and a current flows in a direction to the power source. Thus, by setting the lower limit potential at the output point Vbn of the bias voltage to $V_{dd}$–0.6 [V], it is possible to inhibit the bias circuit 120 from failing to normally operate.

For example, by turning on the switches 1010 and 1020 at the time of start of operation of the bias circuit 120 and then turning off the switches 1010 and 1020, it is possible to rapidly shift the bias circuit 120 to a normal operation point. In addition, a configuration in which the switches 1010 and 1020 are constantly ON or a configuration in which the switches 1010 and 1020 are omitted may be employed.

Figure 11:
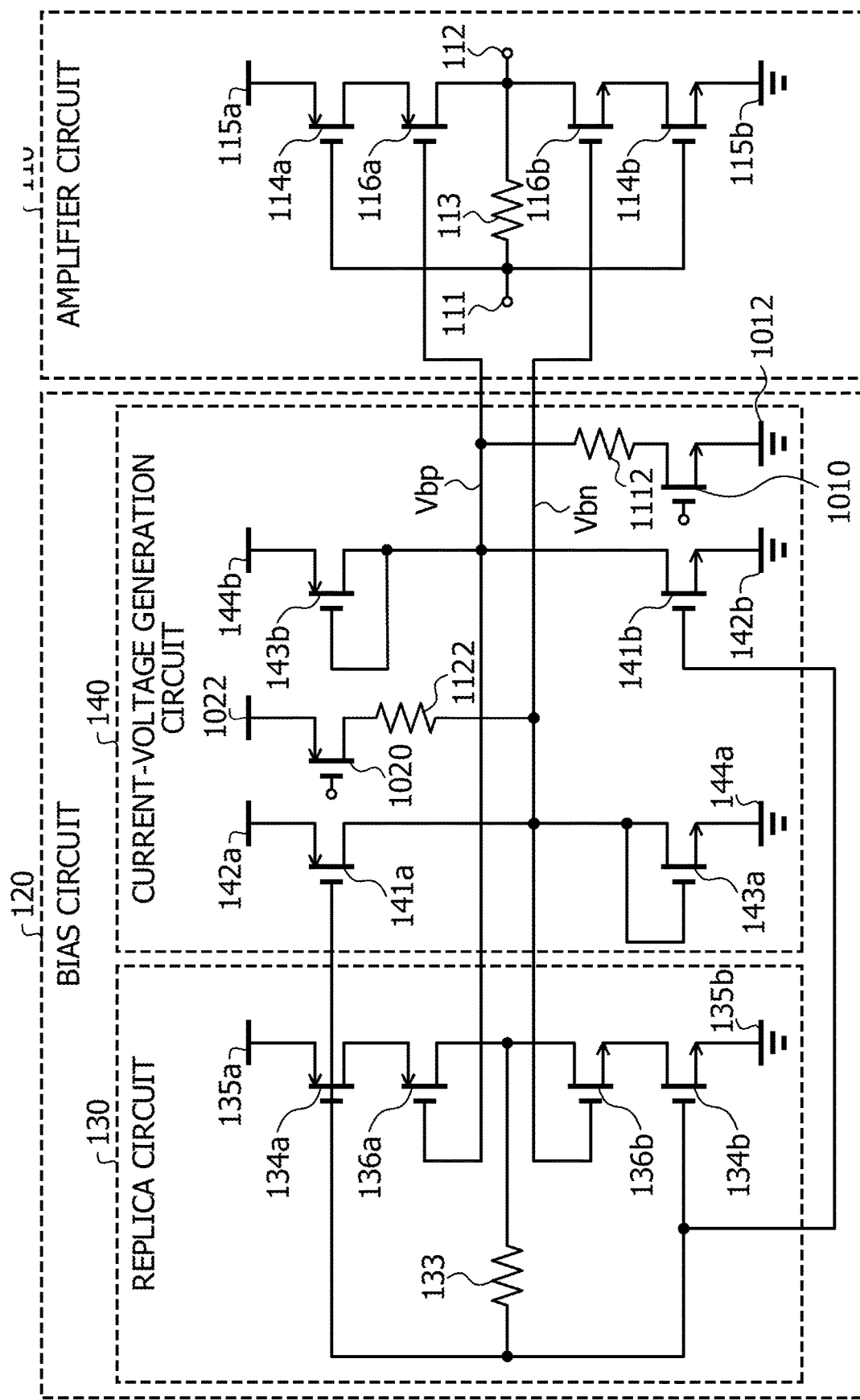
FIG. 11 is a diagram illustrating another example of the amplifier circuit and the bias circuit according to Embodiment 2.

FIG. 11 is a diagram illustrating another example of the amplifier circuit and the bias circuit according to Embodiment 2. In FIG. 11, the same parts as those illustrated in FIG. 10 are designated by the same reference characters, and the description thereof is omitted. As illustrated in FIG. 11, the current-voltage generation circuit 140 of the bias circuit 120 according to Embodiment 2 includes resistors 1112 and 1122 instead of the ground diode 1011 and the power source diode 1021 illustrated in FIG. 10.

By connecting the switch 1010 and the resistor 1112 between the output point Vbp of the bias voltage and the ground 1012, it is possible to inhibit the potential at the output point Vbp from being excessively high. For example, when an ON voltage in the forward direction of the ground diode 1011 is 0.6 [V], if the potential at the output point Vbp of the bias voltage becomes equal to or higher than 0.6 [V] in a state where the switch 1010 is ON, a current flows in the direction to the ground. Thus, by setting the upper limit potential at the output point Vbp of the bias voltage to 0.6 [V], it is possible to inhibit the bias circuit 120 from failing to normally operate.

By connecting the switch 1020 and the resistor 1122 between the output point Vbn of the bias voltage and the constant voltage source 1022, it is possible to inhibit the potential at the output point Vbn of the bias voltage from being excessively low. For example, when an ON voltage in the forward direction of the power source diode 1021 is 0.6 [V], if the potential at the output point Vbn of the bias voltage becomes equal to or lower than $V_{dd}$–0.6 [V] in a state where the switch 1020 is ON, a current flows in the direction to the power source. Thus, by setting the lower limit potential at the output point Vbn of the bias voltage to $V_{dd}$–0.6 [V], it is possible to inhibit the bias circuit 120 from failing to normally operate.

For example, by turning on the switches 1010 and 1020 at the time of start of operation of the bias circuit 120 and then turning off the switches 1010 and 1020, it is possible to rapidly shift the bias circuit 120 to a normal operation point.

A configuration in which the switches 1010 and 1020 are constantly ON or a configuration in which the switches 1010 and 1020 are omitted may be employed. In this case, the resistance values of the resistors 1112 and 1122 are set to sufficiently high resistance values. For example, the resistance values of the resistors 1112 and 1122 are set to be sufficiently higher than that of the transistor (for example, the PMOS transistor 141a or the NMOS transistor 141b) that copies a current.

As described above, similarly as in the bias circuit 120 according to Embodiment 1, in the bias circuit 120 according to Embodiment 2, even when the performance of the transistors is varied, it is possible to inhibit the output voltage range of the amplifier circuit 110 from becoming narrow.

The bias circuit 120 includes a diode (the ground diode 1011 or the power source diode 1021) having an end connected to the constant voltage source 1022 or the ground 1012 and another end connected to the output point of the bias voltage. Alternatively, the bias circuit 120 includes a resistor (the resistor 1112 or the resistor 1122) having an end connected to the constant voltage source 1022 or the ground 1012 and another end connected to the output point of the bias voltage. The output point of the bias voltage is, for example, the connection point of the MOS transistor of the current-voltage generation circuit 140, the diode connected MOS of the current-voltage generation circuit 140, and the gate of the cascode element of the replica circuit 130.

Accordingly, by adjusting the potential at the output point of the bias voltage within a predetermined range, it is possible to inhibit the bias circuit 120 from failing to normally operate.

As described above, according to the bias circuit and the optical receiver, even when the performance of the transistors is varied, it is possible to inhibit the output voltage range of the amplifier circuit from becoming narrow.

For example, in the related art, as the configuration of a transimpedance amplifier (TIA) used in an optical receiver, there is a configuration in which a cascode type inverter is used. To operate a circuit using a cascode element, it is desirable to supply a bias voltage to the cascode element. However, for example, with the bias method with a fixed potential, the signal output range of the TIA may not be wide, depending on variations of the threshold voltage of the transistor due to manufacturing variations of the circuit.

On the other hand, according to each embodiment described above, it is possible to provide a bias voltage to the cascode element such that the drain voltage of the input stage transistor of the TIA is a saturation drain voltage that is the minimum voltage at which the transistor operates. Thus, even when the threshold voltage of the transistor is varied, it is possible to inhibit the output signal range of the TIA from becoming narrow.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A bias circuit comprising:
a replica circuit for an amplifier circuit using a cascode type inverter; and
a generation circuit that generates a bias voltage that causes a drain voltage of an input stage transistor of the amplifier circuit to be a saturation drain voltage, based on an output voltage of the replica circuit, and supplies the generated bias voltage to a cascode element of the amplifier circuit and a cascode element of the replica circuit.

2. The bias circuit according to claim 1,
wherein the amplifier circuit is a TIA (transimpedance amplifier).

3. The bias circuit according to claim 1,
wherein the generation circuit includes
a MOS transistor that has a gate connected to a gate of an input stage transistor of the replica circuit, and
a diode connected MOS that is connected to the MOS transistor, and
wherein a connection point of the MOS transistor, the diode connected MOS, and a gate of the cascode element of the replica circuit is connected to a gate of the cascode element of the amplifier circuit.

4. The bias circuit according to claim 3,
wherein a saturation drain voltage of the MOS transistor is equal to a saturation drain voltage of the input stage transistor and the cascode element of the replica circuit, and
wherein a saturation drain voltage of the diode connected MOS is two times of the saturation drain voltage of the input stage transistor and the cascode element of the replica circuit.

5. The bias circuit according to claim 3, further comprising
a diode or a resistor that has an end connected to a power source or a ground and another end connected to the connection point of the MOS transistor, the diode connected MOS, and the gate of the cascode element of the replica circuit.

6. An optical receiver comprising:
a conversion unit that converts inputted optical signal to an electric signal;
an amplifier circuit that amplifies the electric signal resulting from the conversion by the conversion unit, with a cascode type inverter;
a replica circuit for the amplifier circuit; and
a generation circuit that generates a bias voltage that causes a drain voltage of an input stage transistor of the amplifier circuit to be a saturation drain voltage, based on an output voltage of the replica circuit, and supplies the generated bias voltage to a cascode element of the amplifier circuit and a cascode element of the replica circuit.

* * * * *